(12) United States Patent
Pöchmüller

(10) Patent No.: US 7,113,417 B2
(45) Date of Patent: Sep. 26, 2006

(54) INTEGRATED MEMORY CIRCUIT

(75) Inventor: Peter Pöchmüller, Dresden (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/954,596

(22) Filed: Sep. 30, 2004

(65) Prior Publication Data
US 2005/0108459 A1    May 19, 2005

(30) Foreign Application Priority Data
Sep. 30, 2003   (DE) ................................. 103 45 549

(51) Int. Cl.
*G11C 5/02* (2006.01)
*G11C 5/06* (2006.01)

(52) U.S. Cl. .............................. 365/51; 365/52; 365/63
(58) Field of Classification Search .................. 365/51, 365/52, 63, 230.03, 233
See application file for complete search history.

(56) References Cited

U.S. PATENT DOCUMENTS

| | | | | |
|---|---|---|---|---|
| 5,815,427 A * | 9/1998 | Cloud et al. ................... 365/51 |
| 5,943,287 A * | 8/1999 | Walton ................... 365/230.03 |
| 6,094,375 A * | 7/2000 | Lee ............................. 365/233 |
| 6,157,560 A * | 12/2000 | Zheng ................... 365/230.03 |
| 6,215,720 B1 * | 4/2001 | Amano et al. ......... 365/230.03 |
| 6,317,377 B1 * | 11/2001 | Kobayashi ................... 365/63 |
| 6,622,197 B1 | 9/2003 | Kim |
| 2001/0008491 A1 | 7/2001 | Sumimoto |

OTHER PUBLICATIONS

German Patent Office Examination Report dated Aug. 20, 2004.

\* cited by examiner

*Primary Examiner*—Trong Phan
(74) *Attorney, Agent, or Firm*—Patterson & Sheridan, L.L.P.

(57) ABSTRACT

In a memory circuit integrated on a semiconductor chip, an interface system is formed between the connection pads and associated internal signal lines and contains a respective separate and complete interface circuit for each of at least two different modes of operation of the memory circuit. Each interface circuit is arranged distributed over a plurality of spaced sections of the chip surface such that sections of different interface circuits alternate with one another. Only the interface circuit which is associated with the mode of operation which is desired when the memory circuit is being used is operatively connected between the connection pads and the associated internal signal lines by metallizations in the topmost metallization plane.

19 Claims, 5 Drawing Sheets

INTEGRATED MEMORY CIRCUIT

CROSS-REFERENCE TO RELATED APPLICATIONS

This application claims foreign priority benefits under 35 U.S.C. §119 to co-pending German patent application number DE 103 45 549.3, filed 30 Sep. 2003. This related patent application is herein incorporated by reference in its entirety.

BACKGROUND OF THE INVENTION

1. Field of the Invention

The invention relates to a memory circuit integrated on a semiconductor chip. A preferred but not exclusive area of application for the invention is "DRAMs", i.e., dynamic random access memories.

2. Description of the Related Art

A memory chip accommodates a large multiplicity of memory cells in one or more separate "banks" which respectively occupy a cohesive region of the chip surface. Each bank contains the memory cells typically in a matrix-like arrangement of rows and columns, a switching network which covers the matrix and comprises row and column selection lines ("word lines" and "bit lines"), and also address decoders, line switches, drivers and data amplifiers, in order to connect selected memory cells to data connections on the bank on the basis of address bits, so that data can be written to or read from these cells. In addition, each bank has connections for control signals in order to control the read and write modes. These control signals include not only the address bits but also various time control and switching signals for controlling the flow of the read and write cycles.

The supply voltage is applied, external control signals (clock signals, address bits and control commands) are input and data signals are input and output on the memory chip via external supply lines which are directly and electrically connected to associated contact areas or the "connection pads" on the chip. Between these pads and the internal signal lines connected to the memory bank connections are various circuit arrangements which ensure that the external control signals are transferred to the associated bank control lines in a prescribed logic combination and synchronization and that the data signals are transferred in a prescribed association between the banks' data lines and the data connection pads, respectively. These circuit arrangements thus basically form an "interface system" between the connection pads and the memory bank connections or the internal signal lines routed to these connections. The connection pads, the "interface system" and also the internal signal lines are integrated in regions of the chip surface which are situated outside the surface region occupied by the memory banks.

The market for memory circuits which are mass produced as integrated chips on semiconductor chips is subject to great fluctuations. This applies not only to the demand for memory chips per se but also, in particular, to the rapidly changing demand for different specifications for such chips.

Chip producers want to be able to react as quickly as possible to any demand. However, this is obstructed by the fact that the fabrication time for memory chips is relatively long (e.g., it is currently between four and six months). For this reason, it has become widespread customary practice to design memory chips such that they can be set to one of a plurality of alternative specifications at a stage as late as possible in the production process or even not until the chips are being used in practice. The latter option, i.e., setting during use, is appropriate only for a few operating parameters, e.g., for the burst length (length of the data sequence which is written or read during each access operation) or the "CAS latency" (waiting time between the activation command and the start of the actual read or write mode). In this context, the parameters are set by setting particular bits in a mode register integrated on the chip on the basis of a command from the external memory controller, i.e., more or less by software in the course of operational control.

However, there are also operating or specification parameters whose market-dependent range of fluctuation should be taken into account by virtue of appropriate design of the chip hardware, specifically by virtue of the circuit design of the aforementioned interface system. Such parameters include, by way of example, the data rate relative to the storage clock, the frequency of the storage clock, the frequency of the system clock, the bit length of the data stream sent and received, the external supply voltage and the voltage values of the logic levels in the data sent and received.

To be able to allow for different alternative modes of operation, it is known practice to design integrated memory chips as "combo" chips. In this context, as many elements of the interface system as possible are designed such that they can work in any of the alternative modes of operation, i.e., work "universally". If the various modes of operation require different patterns of signal paths between the existing universal elements, the connection pads and the internal signal lines, then a complex system of logic gates is additionally provided which is capable of producing each of the different signal path patterns on the basis of control potentials. The connections between the logic system and the respective control potential sources are set up prior to delivery of the chip by means of a contact-making operation in the topmost metallization plane. Since this can take place at a very late production stage, e.g., directly before the chip is encapsulated, alignment with the market can be carried out at short notice.

Such customary combo chips have their own drawbacks, however. Since many elements of the interface system and also of the logic system need to work in different modes of operation, compromises are needed in terms of the design and the dimensioning of these elements. Many elements which may have optimum properties for one particular mode of operation will work less well for another mode of operation. Thus, there is little success in designing the interface system in optimum fashion for all modes of operation.

SUMMARY OF THE INVENTION

One aspect of the invention is to design an integrated memory chip such that its interface system can firstly be configured for any one of a plurality of modes of operation at a late stage in production and can secondly work in optimum fashion given any set configuration.

Accordingly, one embodiment of the invention is implemented with a memory circuit containing: at least one memory bank which has a multiplicity of memory cells and connections for accessing the memory cells for the purpose of reading and writing data; a plurality of connection pads to which the external supply lines to the chip are connected for incoming and outgoing signals; an interface system for the signal transfer between the connection pads and associated internal signal lines which are connected to the memory bank connections, wherein the connection pads, the interface system and the associated internal signal lines are integrated in regions of the chip surface which are situated outside the surface regions occupied by the memory bank or the memory banks. In line with one aspect of the invention, for each of M≧2 different modes of operation of the memory circuit, a respective associated configuration of the interface system is implemented as a separate interface circuit containing all the necessary circuit elements for the configuration in question only. Each of the various interface circuits is arranged and distributed over a plurality of spaced sections of the chip surface so that sections of different interface circuits alternate with one another. Only that interface circuit which is associated with the mode of operation desired when the memory circuit is being used is operatively connected between the associated internal signal lines (DL) and the connection pads by metallizations in the topmost metallization plane.

Since each mode of operation has a quite individual interface circuit, which is inherently complete in each case, there is no need for any compromises in the design of the interface system. Each of the individual circuits may be optimized in terms of the design and the characteristics of the individual circuit elements for the mode of operation in question. Secondly, a particular advantage is obtained through the division of each interface circuit into physically separate sections, interleaving them with sections of the respective other interface circuits. The length differences in the signal paths both for the signal transfer between various connection pads and various internal signal lines and for the various interface circuits are smaller than if each interface circuit were to be integrated as a respective cohesive block. The signal propagation times are thus shorter and the involvement for propagation time adjustment can remain lower.

An interface system designed in line with one aspect of the invention naturally requires more circuit elements to implement than the interface system of a conventional combo chip. However, this does not inevitably mean that the chip surface needs to be larger overall than in the case of a combo chip. The size of the surface regions outside the banks is determined primarily by the physical width of the line bundles which transfer the received data bits or the data bits to be sent on the data pads to and from the banks in parallel form within the chip. These line bundles or buses comprise parallel conductor tracks which are usually relatively long and whose specific nonreactive resistances and electrical capacitances therefore need to be as small as possible in order to keep attenuations and propagation times to a minimum. For this reason, the line bundles cannot be miniaturized to the same great extent as the semiconductor circuits in the interface system. As integration technology progresses, it is thus possible to integrate increasingly more semiconductor circuits within the chip surface's regions taken up by the line bundles.

BRIEF DESCRIPTION OF THE DRAWINGS

The principle of the invention is explained in more detail below using exemplary embodiments with reference to drawings in which.

In the various figures, elements which are the same or similar have been denoted using the same abbreviations in large letters, which usually have an appended number or small letter as a serial number. When a plurality of similar elements are mentioned in the text of the description, the numbers in question are put in square brackets [ ], with a colon between the numbers signifying the word "to".

DETAILED DESCRIPTION OF THE PREFERRED EMBODIMENT

Figure 1:
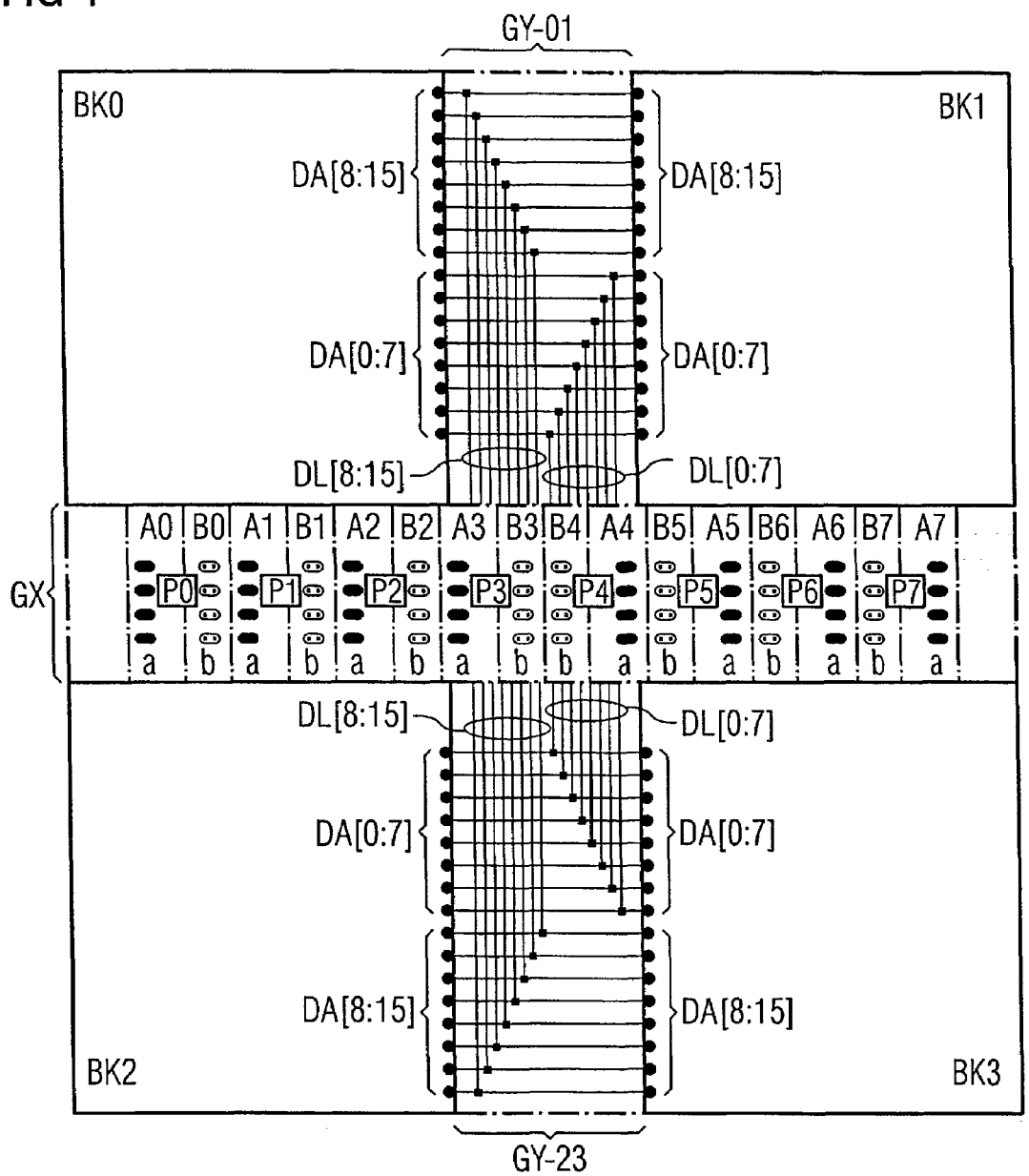
FIG. 1 shows a schematic diagram of the design of an integrated memory chip with four banks and an inventive arrangement of an interface system for two alternative modes of operation relating to the data rate.

The memory chip shown in FIG. 1 contains four memory banks BK[0:3], which are integrated in four quadrants of the rectangular chip surface. A cross-shaped surface zone between the banks incorporates all of the peripheral circuit elements for controlling access to the memory cells in the banks. This cross-shaped peripheral zone, which is not taken up by the banks, comprises a region which runs in the X direction (direction of the row numbering in the banks), or the "spine" of the chip, which is also referred to hereinafter as the "primary channel" GX, and two regions which are at right angles thereto in the Y direction (direction of the column numbering) and branching off oppositely, also referred to hereinafter as "subsidiary channels" GY. GY-01 is the subsidiary channel between the banks BK0 and BK1, and GY-23 is the subsidiary channel between the banks BK2 and BK3.

The primary channel GX also incorporates the connection pads for the external supply lines to the chip in a topmost metallization plane. Only the connection pads P for the data bits are shown; in the case illustrated, there are eight data pads P[0:7], i.e. the chip shown is an "×8 chip", on which a data stream can be input and output in parallel format with a bit length n=8. This simplified example has been chosen to retain the clarity of the drawing; currently, ×16 chips with 16 data pads are most common. The chip also has a plurality of further connection pads for inputting address, command and clock information. These further pads are not shown in FIG. 1 for reasons of clarity and may likewise be integrated in the topmost metallization plane in the region of the primary channel GX.

The memory chip shown in FIG. 1 is in a form such that it can be set to either one of two different modes of operation at a late stage in fabrication. The first mode of operation may be the double data rate mode (DDR mode), for example, and the second mode of operation may be the single data rate mode (SDR mode), for example. The invention will be explained below using this example at first.

If the memory chip shown in FIG. 1 is intended to work in DDR mode, then two data packets of n=8 bits each are read or written at the same time on two different halves of the respectively addressed memory bank in each period of the storage clock. To this end, each bank has 2 n=16 data connections, namely n=8 data connections DA[0:7] on the first half and n=8 data connections DA[8:15] on the second half. The data connections DA[0:7] are connected to associated internal data lines DL[0:7], and the data connections DA[8:15] are connected to associated internal data lines DL[8:15]. In read mode, each double packet read simultaneously via the data lines DL[0:15] is split into two successive single packets, so that the 8-bit single packets appear on an internal 8-bit data bus (not shown) in succession at a data rate equal to double the storage clock, and from there, the packets are channeled at this "double" data rate to the eight data pads, using appropriately clocked transmission sampling circuits. In write mode, the 8-bit single packets received on the pads P[0:7] at the "double" data rate and channeled to the data bus are combined in respective pairs into a 16-bit double packet, and the double packets are then written in parallel to the respectively addressed bank at the storage clock using the data lines DL[0:15].

If the memory chip shown in FIG. 1 is intended to work in SDR mode, then, in read mode, on the respectively addressed memory bank, only one 8-bit data packet is read on a respectively addressed bank half in each period of the storage clock, either from the 8 data connections DA[0:7] via the data lines DL[0:7] or from the 8 data connections DA[8:15] via the data lines DL[8:15], depending on the addressing. The 8-bit packets are routed directly to the internal 8-bit data bus in succession at a data rate equal to the storage clock, and from there are channeled to the eight data pads P[0:7] at this "single" data rate. In write mode, the 8-bit packets received on the pads P[0:7] at the "single" data rate and channeled to the data bus are coupled directly to the data lines DL[0:7] or DL[8:15] and are transferred to the associated data connections of the respectively addressed bank.

The internal 8-bit data bus runs in the region of the primary channel GX in or below the topmost metallization plane and is not shown in FIG. 1, so as not to make the drawing confusing. The data lines DL branch off from the primary channel GX and run in the subsidiary channels GY to the data connections DA adjoining at that point on the banks BK.

All circuit elements which are needed in DDR mode for data transfer between the pads P[0:7] and the internal data lines DL[0:15] are contained in a first interface circuit which is split ("divided up") into physically spaced sections A[0:7] which are integrated in the primary channel GX and whose boundaries are indicated in FIG. 1 by dash-dot lines. This interface circuit A[0:7] contains circuit elements designed specifically for DDR mode, such as the transmission and the reception sampling circuits for the increased data rate and the multiplexer and the latch circuits for the parallel/serial conversion and the serial/parallel conversion of the data packet sequences between the data lines DL and the internal data bus.

All circuit elements which are required in SDR mode for data transfer between the pads P[0:7] and the internal data lines DL[0:7] or DL[8:15] are contained in a second interface circuit, which is split ("divided up") into physically spaced sections B[0:7] which are likewise integrated in the primary channel GX, specifically with physical interleaving with the sections A[0:7] of the first interface circuit. The second interface circuit B[0:7] contains circuit elements designed specifically for SDR mode, such as the transmission and reception sampling circuits for the single data rate. Multiplexer and latch circuits for parallel/serial conversion and serial/parallel conversion of the data packet sequences between the data lines DL and the internal data bus are not contained in the second interface circuit B[0:7]. In their place, a simple bank multiplexer without a latch function is sufficient for SDR mode.

The respectively desired mode of operation is set by making contact in the topmost metallization plane. To this end, the sections A[0:7] of the first interface circuit have respective locations "a" prescribed in them, at which metallization operations can be used to form conductive bridges between two points. The sections B[0:7] of the second interface circuit have similar locations "b" prescribed in them. The number and position of these bridge locations have been shown to be similar in the drawing for the sake of simplicity, but in practice the number and position of the bridge locations may be entirely different from section to section.

The "a" bridge points are connected up to selected circuit points in the sections A[0:7] in question such that the first interface circuit is operative (for DDR mode) precisely at the time when the bridges in question are made conductive through metallization. The "b" bridge points are connected up to selected circuit points in the sections B[0:7] in question such that the second interface circuit is operative (for SDR mode) precisely at the time when the bridges in question are made conductive through metallization. FIG. 1 shows the case in which the "a" bridges are closed (i.e., conductive) and the "b" bridges are open (i.e., nonconductive), and thus, the memory chip is set to DDR mode.

Similarly, as described above with reference to FIG. 1 for the example of an option between DDR and SDR mode, a memory chip may also be designed for an option between two (or even more than two) other modes of operation. Recently, there are also options for quadruple data rate (DDR2 mode) or octuple data rate (DDR3 mode), with the repetition rate of the data packets which are input and output on the data pads being four or eight times the storage clock, respectively. Each of the different modes (SDR, DDR, DDR2, DDR3, etc.) requires a different type of data distribution between the data pads and the bank connections. The various modes of operation therefore require different kinds of multiplexer functions as well as different kinds of conversion of the address information. In addition, the clock frequencies used differ at least in part, which makes it desirable to have different dimensioning for the clocked components on a case by case basis. In line with one aspect of the invention, each of two (or more) such different modes of operation has a dedicated interface circuit which is respectively split into spaced sections, physically interleaved with sections of the respective other interface circuit (s).

Embodiments of the invention are not limited to mode of operation options relating to the data rate, but rather may also be used for the option between alternative modes of operation which relate to aspects other than the ratio of the data rate to the storage clock frequency. Such an aspect may be the level of the storage clock frequency itself, for example. For specific types of use of the memory chip, e.g., for graphics applications, higher storage clock frequencies are desired than for other types of use. In such cases, each storage clock option has a dedicated interface circuit which is respectively split into spaced sections, physically interleaved with sections of the other interface circuit(s), and the elements of the dedicated interface circuit are optimized for the respective storage clock frequency.

There may also be different options relating to the bit length of the data packets which are input and output on the data pads. In this context, either the total quantity or just a subset of the data pads is used on a case by case basis, which may require that the data pads be assigned to the lines of the data bus and to the data lines of the banks differently on a case by case basis and also that the address information be handled differently on a case by case basis. In this context, each bit length option may have a respective independent interface circuit in an arrangement based on aspects of the invention. Further examples of alternative modes of operation for which respective dedicated interface circuits may be provided include alternative supply voltages and alternative power levels, such as "low power" mode and "high power" mode.

FIG. 1 does not show the details of the circuit elements in the sections A[0:7] and B[0:7] of the two interface circuits, and accordingly also does not show the appearance of the connection pattern between these circuit elements and the connection points of the bridges "a" and "b" in detail. A person skilled in the art of designing integrated circuits will readily be able to implement the respective correct patterns of the bridge locations and of the connections within the associated circuit sections so that contact-making operations in the topmost metallization plane can be used for actively selecting the respective interface option. It is therefore not necessary to show a drawing of all of the details or to describe them, which may even depart from the scope of the present specification. To give a good illustration of the invention and its advantages over the known "combo" technology, however, FIGS. 2 to 5 are subsequently used to describe a highly simplified "primitive" example, specifically using a memory chip which is designed to select between two bit length options to work either as an ×4 chip or as an ×2 chip.

FIGS. 2 to 5 respectively show a fragment of the region of the chip surface in which the chip's central data bus runs. This region is situated outside the regions which accommodate the banks with the memory cells. In a chip with two or four banks, the data bus normally runs in the primary channel (or spine) region between the banks, which accordingly need to be spaced apart from one another in line with the width of the bus. In the cases shown, the data bus DB comprises n=4 parallel-running lines BL[a:d], according to the largest data bit length to be chosen. All of the figures show just that half of the interface system which, in read mode, is intended to transfer the data read from the memory cells from the data bus DB to the pads P[0:3]. In reality, the data interface system is bidirectional. The other half, which in write mode is intended to transfer the data received on the pads to the bus, is not shown for reasons of clarity of the drawing.

Figure 2:
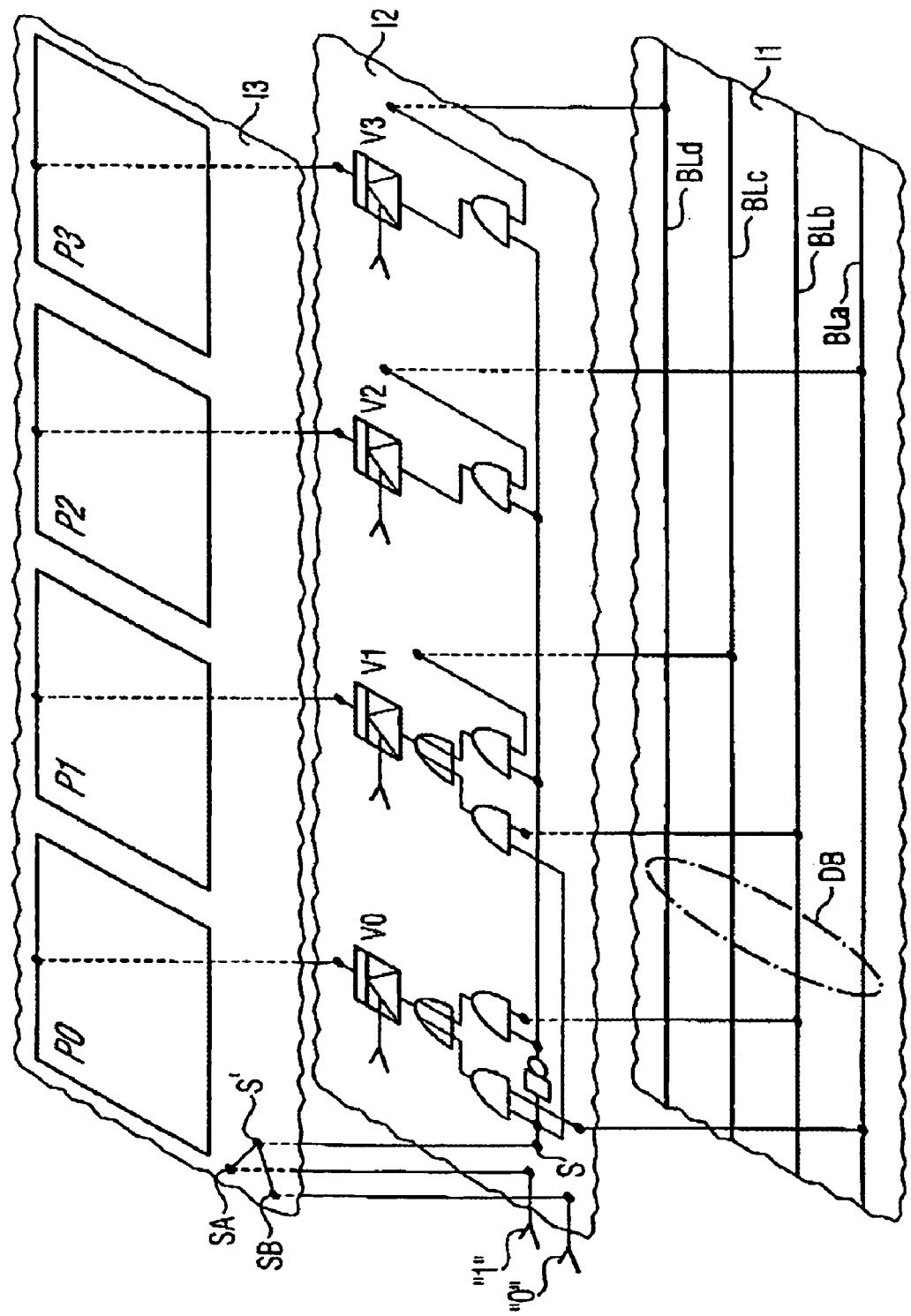
FIG. 2 shows a perspective exploded view of an example of the design and physical arrangement of a "combo" interface system based on the prior art for two alternative modes of operation relating to the data bit length in an integrated memory chip.

In line with FIG. 2 which illustrates the known "combo" technology, the four lines BL[a:d] of the data bus DB are formed by metallizations in the primary channel of the chip surface. Likewise in the primary channel, a row of n=4 data connection pads P0, P1, P2, P3 is formed in a manner oriented to the data bus DB. The four pads P[0:3] have a relatively large surface area to allow the pads to be mechanically connected up to the n=4 associated data pins of the package base by bonding or soldering before the chip is encapsulated. In addition, the primary channel incorporates the component parts of an interface system which is designed to set up signal paths between the four pads P[0:3] and the four bus lines BL[a:d] in different configurations, depending on the mode of operation chosen. Each bus line BL branches into a plurality of data lines (not shown), according to the number of banks. The interface system contains semiconductor elements and connecting lines between these elements and is shown in the form of a diagram which portrays only the electrical circuit diagram.

In FIG. 2 (and also in FIGS. 3 to 5), the data bus DB is shown in one plane I1, the elements of the interface system are shown in another plane I2, and the pads P[0:3] are shown in yet another plane I3. The plane I3 is actually the topmost metallization plane, while the planes I2 and I1 are shown entirely separate from one another and entirely separate from the plane I3, merely for reasons of illustration. In reality, the data bus DB as well as line runs and other parts of the interface system may likewise be integrated in the topmost plane I3. The exploded view in a plurality of planes serves merely to provide visual isolation between the group of pads, the circuit group of the interface system and the group of bus lines for illustrative purposes. Accordingly, the drawing shows the contact connections between the groups always as vertical line runs between the planes (which need not necessarily be in reality).

In the interface system shown in FIG. 2, each signal path intended to transfer data from a bus line BL to a pad P contains a clocked amplifier V. As shown, there are a total of n=4 such amplifiers V[0:3], respectively for each of the four pads P[0:3] to which the output of the associated amplifier is connected respectively. The amplifiers' clocking is synchronized with the clock of the data sequence. In one embodiment, upon every falling edge of a clock signal applied to its clock connection, each amplifier's output "latches" the binary value of the data bit received at its input until the arrival of the next falling clock edge. The clock line running through the interface system has not been shown for reasons of clarity.

During operation as an ×2 chip, i.e., in ×2 mode, only the bus lines BLa and BLb and the pads P0 and P1 with the amplifiers V0 and V1 need to be used, for example, in the following assignment pattern:

BLa–V0–P0

BLb–V1–P1

In this case only two signal paths need to be activated, namely a path from BLa via V0 to P0 and a path from BLb via V1 to P1. During operation as an ×4 chip, i.e., in ×4 mode, all four bus lines BL[a:d] and all four paths P[0:3] with all four amplifiers V[0:3] are used, for example, in the following assignment pattern:

BLa–V2–P2

BLb–V0–P0

BLc–V1–P1

BLd–V3–P3

In this case, it is thus necessary to activate four signal paths, none of which correspond to any such signal paths which are used in ×2 mode in the example. In addition, two of the four amplifiers, namely the amplifiers V0 and V1 in the assignment patterns mentioned, are used both in ×2 mode and in ×4 mode.

To select between the two modes, the interface system thus requires complex switching logic which can assume two different switching states to produce either one or the other assignment pattern. In the example shown in FIG. 1, this switching logic comprises a combination of AND gates, OR gates and an inverter which is inserted between the four bus lines BL[a:d] and the inputs of the four amplifiers V[0:3] and whose switching state is dependent on the logic value "0" or "1" of a control potential at a circuit point S. From the diagram shown from the switching logic, it can be seen (without the need for a separate description in this regard) that the above assignment pattern is obtained for ×2 mode when S is at logic potential "1", and that the above assignment pattern is obtained for ×4 mode when S is at logic potential "0". In ×2 mode, the amplifiers V2 and V3 keep the pads P2 and P3 constantly at "0" potential, while the amplifiers V0 and V1 change the potentials of the pads P0 and P1 in line with the data bits supplied via BLa and BLb. In ×4 mode, the amplifiers V[0:3] change the potentials of all four pads P[0:3] in line with the data bits supplied via the four bus lines BL[a:d].

To be able to stipulate the respective switching state of the switching logic, the circuit point S is connected to a contact point S' of the topmost metallization plane I3. The contact point may have two further adjacent contact points SA and SB. SB is permanently connected to the source of the "0" potential (e.g., ground or "low" potential), and SA is permanently connected to the source of the "1" potential ("high" potential, e.g., +2.4 volts with reference to ground). To configure the memory chip as an ×2 chip, S' is connected to the contact point SA by means of metallization in the plane I3. To configure the memory chip as an ×4 chip, S' is connected to the contact point SB by means of metallization in the plane I3. The metallization in question can be carried out in a final metallization step, e.g., at the same time as the pads P[0:3] are formed.

Figure 3:
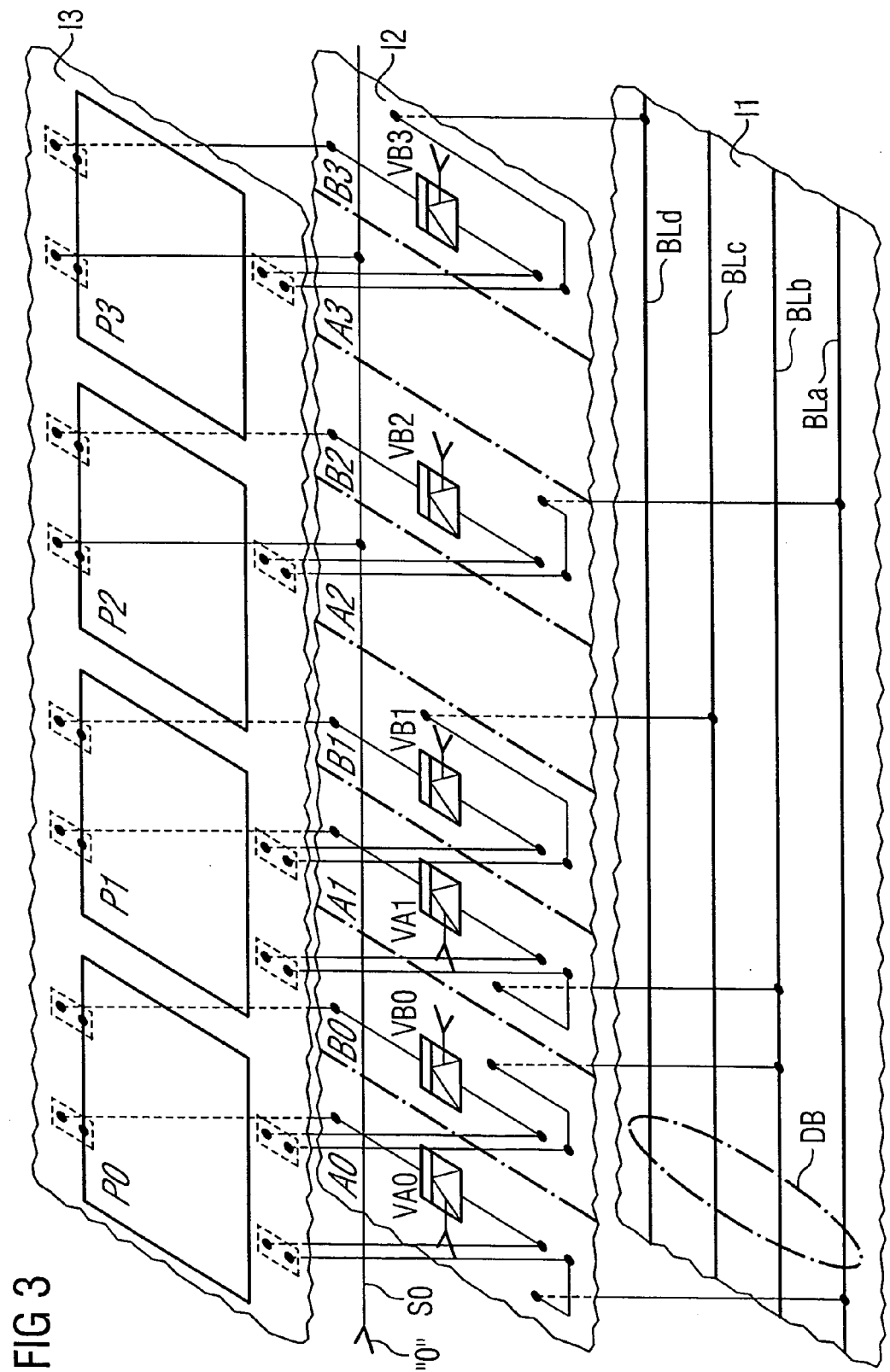
FIG. 3 shows a perspective exploded view illustrating an inventive interface system for two alternative modes of operation relating to the data bit length prior to setting of the mode of operation.

The known "combo" technology described above with reference to FIG. 2 has the drawback of extended and in some cases different propagation times on the signal paths on account of the switching logic. These drawbacks are avoided in the inventive interface system shown in FIG. 3. As shown in FIG. 3, the interface system is divided into eight subregions or "sections", namely four sections A[0:3] and four sections B[0:3], with the A sections and the B sections alternating with one another in the direction of the length of the bus DB. The sections are delimited in the drawing by thick dash-dot lines. The "pitch" of the A sections and of the B sections corresponds to the respective pitch of the connection pads P[0:3], at least approximately, i.e., the A sections and also the B sections are respectively at about the same distance from one another as the pads P[0:3].

As shown in FIG. 3, the interface system between the bus lines L[0:3] and the pads P[0:3] contains two mutually independent interface circuits, one for ×2 mode and one for ×4 mode. The elements of the interface circuit for ×2 mode are integrated only in A sections, and the elements of the interface circuit for ×4 mode are integrated only in the B sections. Specifically, the interface circuit for ×2 mode contains only two amplifiers VA0 and VA1, which are integrated in the A sections A0 and A1, while the interface circuit for ×4 mode contains four amplifiers VB[Q:3], which are integrated in the B sections B[0:3].

In ×2 mode, only the bus lines BLa and BLb and the pads P0 and P1 need to be used, as in the known case shown in FIG. 2, which means that the following signal paths need to be set up:

BLa–VA0–P0

BLb–VA1–P1

In ×4 mode, all four bus lines BL[a:d] and all four pads P[0:3] need to be used, likewise as in the case in FIG. 2, and the following signal paths need to be set up:

BLa–VB2–P2

BLb–VB0–P0

BLc–VB1–P1

BLd–VB3–P3

Hence, none of the amplifiers which are used in one mode are also used in the other mode. The amplifiers can thus each be designed in optimum fashion for the respective mode. For each mode, the amplifiers are physically close to and each at the same distance from their associated pads, and the fact that each interface circuit is inherently complete also means that there is no need for any switching logic in order to select the respective desired mode. The aforementioned propagation time problems thus do not arise.

The interface system shown in FIG. 3 needs to be set to the respective desired mode of operation by forming conductive bridges in the topmost metallization plane I3. To this end, a multiplicity of contact pairs is formed in the plane I3. These contact pairs are respectively shown within small rectangular frames shown in dashed lines in FIG. 3. The connections to be set up in the various modes between the respective bus lines used and the inputs of the respective amplifiers used may be selected via such a contact pair in the topmost metallization plane I3. The connections to be set up between the amplifiers and the respective pads used also run via a respective contact pair in the plane I3. In addition, in the metallization plane I3, a respective contact pair is arranged between each of the two pads P2 and P3 and a rail which is connected to the source of the logic potential "0".

Before the mode of operation is set, the two contacts of all of the contact pairs shown have no reciprocal conductive connection, i.e., all of the bridges in the plane I3 are "open", as shown in FIG. 3.

Figure 4:
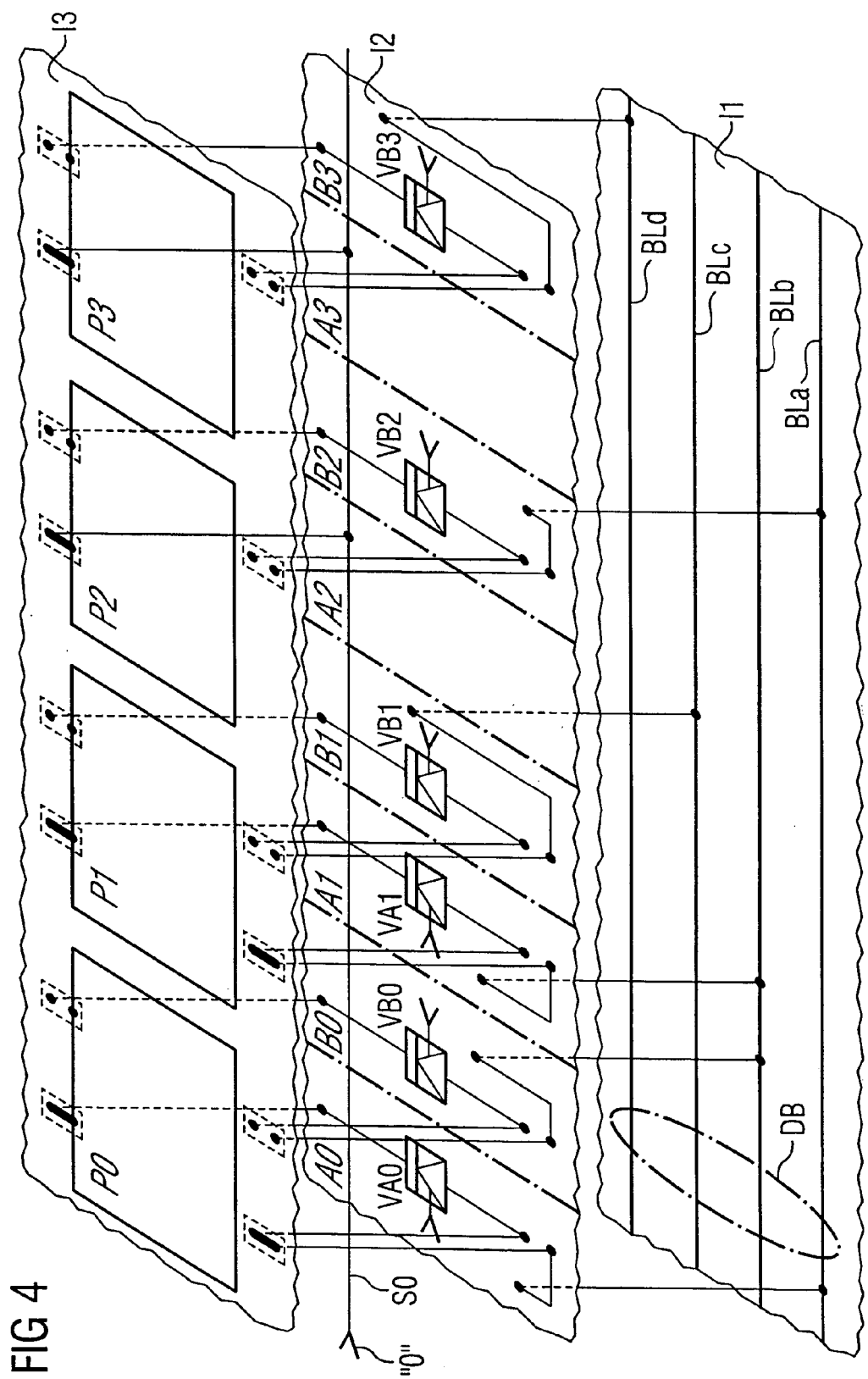
FIG. 4 shows the interface system from FIG. 3 after being set to the first mode of operation.

To set ×2 mode, a metallization step in the plane I3 is used, as FIG. 4 shows, to "close" only the following bridges:
  Bridge from the bus line BLa to the amplifier VA0,
  Bridge from the amplifier VA0 to the pad P0,
  Bridge from the bus line BLb to the amplifier VA1,
  Bridge from the amplifier VA1 to the pad P1,
  Bridge from "0" potential to the pad P2,
  Bridge from "0" potential to the pad P3.

All other bridges remain open. This results in the correct signal path pattern for ×2 mode. The pads P2 and P3 which are not required are kept at "0" potential, and the amplifiers VB[0:3] remain decoupled.

Figure 5:
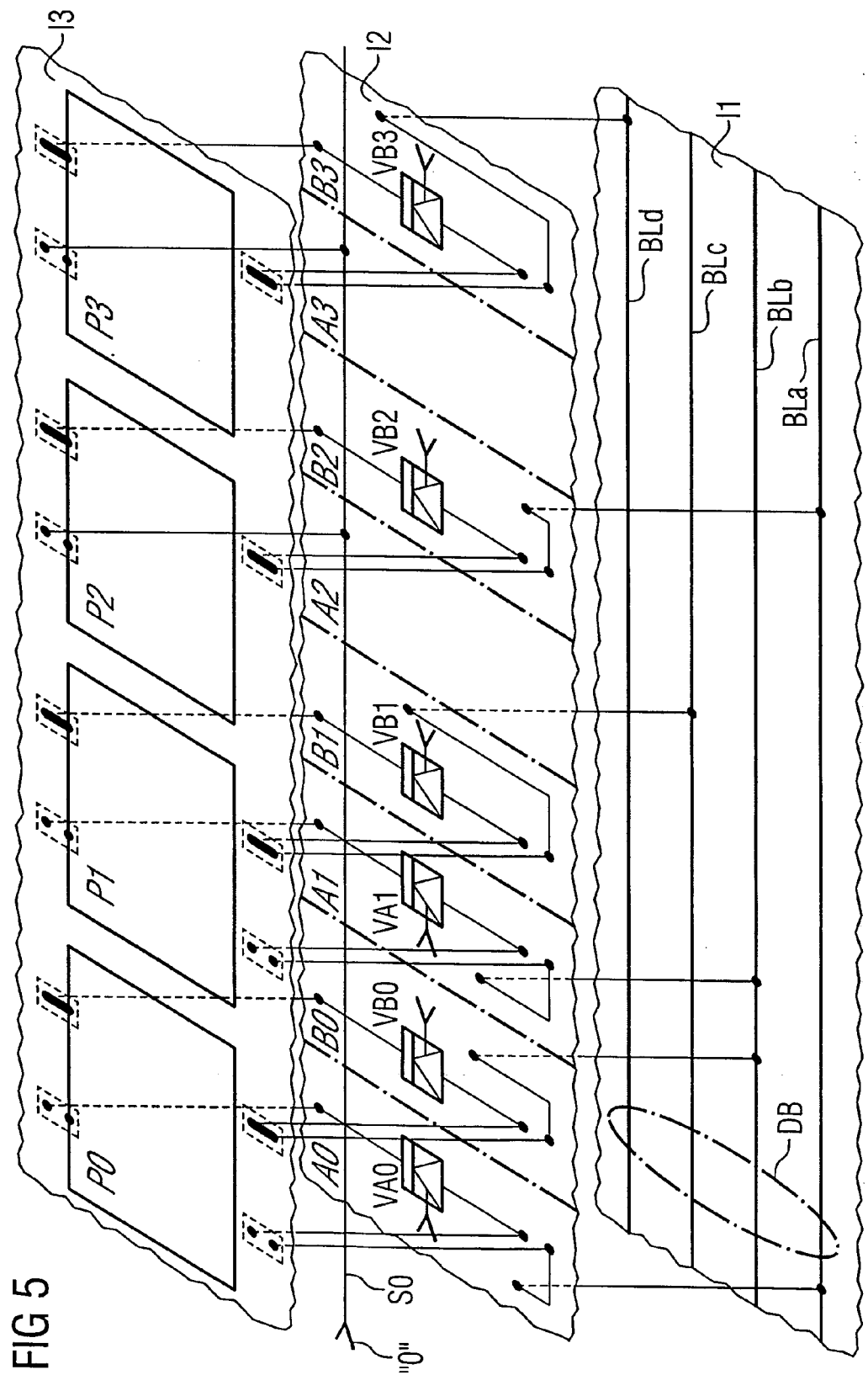
FIG. 5 shows the interface system from FIG. 3 after being set to the second mode of operation.

To set ×4 mode, a metallization step in the plane I3 is used, as FIG. 5 shows, to "close" only the following bridges:
  Bridge from the bus line BLa to the amplifier VB2,
  Bridge from the amplifier VB2 to the pad P2,
  Bridge from the bus line BLb to the amplifier VB0,
  Bridge from the amplifier VB0 to the pad P0,
  Bridge from the bus line BLc to the amplifier VB1,
  Bridge from the amplifier VB1 to the pad P1,
  Bridge from the bus line BLd to the amplifier VB3,
  Bridge from the amplifier VB0 to the pad P0.

All other bridges remain open. This results in the correct signal path pattern for ×4 mode. The amplifiers VA[0:1] remain decoupled.

In all of the exemplary embodiments of the invention which are shown in FIGS. 1 and 3 to 5, only m=2 independent interface circuits are respectively provided in a divided up and physically interleaved arrangement, so as to be able to select between two alternative modes of operation. It is also possible to provide m>2 independent interface circuits in a similarly divided up and physically interleaved arrangement, so as to be able to select between more than two modes of operation.

In one embodiment, the number of sections per interface circuit is at least equal to the number n of data pads which are arranged in a row along the primary channel carrying the data bus. This may provide the advantage that the close surroundings of each data pad may contain a respective section of each interface circuit, such as the section which contains the circuit elements with which the data pad in question is intended to come directly into contact. In one embodiment, n regions are formed along the row of n data pads, as far as possible in the same "pitch" of the data pads. Each region may contain a respective section of each of the m interface circuits (the boundaries of the regions are indicated in FIG. 1 by the thicker dash-dot lines). If not all of the elements of the interface circuits are situated within n respective sections along the pad row space, then it may be possible for further sections of the interface circuits to be integrated in other regions of the peripheral zone, e.g., in the subsidiary channels GY-01 and GY-23.

In one embodiment, each of the independent interface circuits comprises not only the elements of the signal paths between the data pads and the data connections of the banks but also the elements of the other signal paths and the combinational logic circuits between the other connection pads and the other memory bank connections, i.e., between the command and address bit pads, on the one hand, and the control and address connections of the banks, on the other. Such case may apply when these other signal paths and combinational logic circuits likewise require a different design for alternative modes of operation, e.g., on account of a different command structure or different addressing schemes in the various modes of operation.

Some of the circuits which are accommodated in the peripheral zone of the banks and do not require a different design for different specifications of the memory chip may need to be provided only once. This may concern, by way of example, the voltage supply block, which contains various voltage generators and regulators, and the test block, which is used to condition the memory circuit to perform particular tests before the memory circuit is completed. Such blocks may respectively be integrated in cohesive form, i.e., without dividing them up into interleaved sections, e.g., in the regions at the ends of the primary channel GX, which are shown as empty regions in FIG. 1.

While the foregoing is directed to embodiments of the present invention, other and further embodiments of the invention may be devised without departing from the basic scope thereof, and the scope thereof is determined by the claims that follow.

What is claimed is:

1. A memory circuit integrated on a semiconductor chip, comprising:
    at least one memory bank having a plurality of memory cells and a plurality of memory bank connections for accessing the memory cells for reading and writing data;
    a plurality of connection pads connectable to external supply lines for transferring incoming and outgoing signals; and
    an interface system for transferring signals between the plurality of connection pads and a plurality of internal signal lines connected to the plurality of memory bank connections, wherein the interface system comprises a plurality of interface circuits, each interface circuit corresponding to a different one of a plurality of modes of operation of the memory circuit, wherein each interface circuit is disposed in a plurality of separate sections, and wherein at least one of the plurality of interface circuits associated with a selected mode of operation of the plurality of modes of operation for the memory circuit is operatively connected between the plurality of internal signal lines and the plurality of connection pads by a metallization structure in a topmost metallization plane of the semiconductor chip.

2. The memory circuit of claim 1, wherein the plurality of connection pads, the interface system and the plurality of internal signal lines are disposed in regions of the semiconductor chip which are situated outside of surface regions over the at least one memory bank.

3. The memory circuit of claim 1, wherein, for each mode of operation of the memory circuit, a respective configuration of the interface system is implemented as a separate interface circuit containing all circuit elements for the respective configuration.

4. The memory circuit of claim 3, wherein each interface circuit is distributed over a plurality of spaced sections of a chip surface so that sections of different interface circuits alternate with one another.

5. The memory circuit of claim 1, wherein the plurality of connection pads comprises $n \geq 2$ data pads for incoming and outgoing data.

6. The memory circuit of claim 5, wherein the interface system is configured to control data transfer between the data pads and the plurality of internal signal lines which are connected to the plurality of data connections of the at least one memory bank.

7. The memory circuit of claim 5, wherein the n data pads are arranged in a row extending along an internal data bus.

8. The memory circuit of claim 7, wherein n successive subregions of the interface system are integrated along the row of data pads, with each subregion respectively containing m sections corresponding to the plurality of interface circuits.

9. The memory circuit of claim 8, wherein the plurality of memory banks comprise an even number of memory banks arranged in two rows on both sides of a chip surface region which extends in a first direction to form a primary channel containing the internal data bus and the row of data pads, wherein adjacent memory banks in each row of memory banks have a respective chip surface region between them as a subsidiary channel which extends at right angles to the primary channel and contains the signal lines routed to the data connections of the memory banks.

10. The memory circuit of claim 9, wherein the total number q of subregions in the interface system is greater than n, and wherein at least some of the remaining q–n subregions of the interface system are integrated in the subsidiary channel.

11. The memory circuit of claim 1, wherein plurality of modes of operation of the memory circuit is selectably configurable between a single data rate mode and a double data rate mode.

12. A method for configuring a memory circuit, comprising:
    providing, in a configurable layer, a plurality of connection pads connectable to external lines for transferring incoming and outgoing signals;
    providing an interface system for transferring signals between the plurality of connection pads and a plurality of internal signal lines connected to a plurality of memory banks, wherein the interface system comprises a plurality of interface circuits corresponding to a plurality of modes of operation of the memory circuit, wherein each interface circuit is disposed in a plurality of separate sections, wherein each section of each interface circuit includes one or more connections to one or more contact pairs in the configurable layer; and
    selectively connecting the plurality of connection pads to a selected interface circuit of the plurality of interface circuits associated with a selected mode of operation of the plurality of modes of operation for the memory circuit by bridging one or more respective contact pairs connected to the selected interface circuit, and wherein the selected interface circuit associated with the selected mode of operation for the memory circuit is operatively connected between the plurality of internal signal lines and the plurality of connection pads by a metallization structure in a topmost metallization plane of the memory circuit.

13. The method of claim 12, wherein the plurality of separate sections of the plurality of interface circuits are disposed in an interleaved arrangement.

14. The method of claim 12, wherein the plurality of separate sections correspond in number to the plurality of connection pads.

15. The method of claim 12, wherein the interface system is configured to control data transfer between the plurality of pads and the plurality of internal signal lines which are connected to a plurality of data connections of a plurality of memory banks.

16. An integrated circuit, comprising:
   a first layer of the integrated circuit comprising a plurality of internal signal lines;
   a second layer of the integrated circuit comprising a plurality of interface circuits; and
   a third layer of the integrated circuit comprising a plurality of connection pads for connecting to external line, wherein the plurality of interface circuits are configured to control communication between the plurality of internal signal lines and the plurality of connection pads, wherein the plurality of interface circuits corresponds to a plurality of modes of operation of the integrated circuit, wherein each interface circuit is disposed in a plurality of separate sections, and wherein a selected interface circuit of the plurality of interface circuits associated with a selected mode of operation for the integrated circuit is operatively connected between the plurality of internal signal lines and the plurality of connection pads by a metallization structure in a topmost metallization plane of the integrated circuit.

17. The system of claim 16, wherein the plurality of separate sections of the plurality of interface circuits are disposed in an interleaved arrangement.

18. The system of claim 16, wherein the integrated circuit is a memory circuit selectably configurable between a single data rate mode and a double data rate mode.

19. The system of claim 16, wherein the plurality of separate sections correspond in number to the plurality of connection pads.

* * * * *